United States Patent
Satoh et al.

(10) Patent No.: US 9,373,663 B2
(45) Date of Patent: Jun. 21, 2016

(54) LANDING PAD IN PERIPHERAL CIRCUIT FOR MAGNETIC RANDOM ACCESS MEMORY (MRAM)

(71) Applicant: Avalanche Technology Inc., Fremont, CA (US)

(72) Inventors: Kimihiro Satoh, Beaverton, OR (US); Yiming Huai, Pleasanton, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 14/033,374

(22) Filed: Sep. 20, 2013

(65) Prior Publication Data

US 2015/0084140 A1    Mar. 26, 2015

(51) Int. Cl.
*H01L 27/112*    (2006.01)
*H01L 27/22*    (2006.01)

(52) U.S. Cl.
CPC .................................... *H01L 27/222* (2013.01)

(58) Field of Classification Search
CPC ...................... H01L 23/5226; H01L 27/11286; H01L 27/222
See application file for complete search history.

(56) References Cited

U.S. PATENT DOCUMENTS

| 6,153,517 | A | 11/2000 | Chuang et al. | |
| 2003/0063416 | A1* | 4/2003 | Hasegawa | 360/324.12 |
| 2004/0157427 | A1* | 8/2004 | Motoyoshi | 438/622 |
| 2007/0023806 | A1* | 2/2007 | Gaidis et al. | 257/295 |
| 2014/0177326 | A1* | 6/2014 | Doyle et al. | 365/158 |

* cited by examiner

*Primary Examiner* — Howard Weiss
*Assistant Examiner* — Sue Tang
(74) *Attorney, Agent, or Firm* — Bing K. Yen

(57) ABSTRACT

The present invention is directed to a memory device having a via landing pad in the peripheral circuit that minimizes the memory cell size. A device having features of the present invention comprises a peripheral circuit region and a magnetic memory cell region including at least a magnetic tunnel junction (MTJ) element. The peripheral circuit region comprises a substrate and a bottom contact formed therein; a landing pad including a first magnetic layer structure formed on top of the bottom contact and a second magnetic layer structure separated from the first magnetic layer structure by an insulating tunnel junction layer, wherein each of the insulating tunnel junction layer and the second magnetic layer structure has an opening aligned to each other; and a via partly embedded in the landing pad and directly coupled to the first magnetic layer structure through the openings.

19 Claims, 7 Drawing Sheets

LANDING PAD IN PERIPHERAL CIRCUIT FOR MAGNETIC RANDOM ACCESS MEMORY (MRAM)

BACKGROUND

The present invention relates generally to a memory device, and more particularly, to a spin transfer torque magnetic random access memory (STT-MRAM) device having via landing pads in peripheral circuit thereof.

Spin transfer torque magnetic random access memory (STT-MRAM) is a new class of non-volatile memory, which can retain the stored information when powered off. A STT-MRAM device normally comprises an array of memory cells, each of which includes at least a magnetic memory element and a selection transistor coupled in series between appropriate electrodes. Upon application of an appropriate current to the magnetic memory element, the electrical resistance of the magnetic memory element would change accordingly, thereby switching the stored logic in the respective memory cell.

The magnetic memory element typically includes at least a magnetic reference layer and a magnetic free layer with a non-magnetic tunnel junction layer interposed therebetween, thereby forming a magnetic tunneling junction (MTJ). The magnetic reference layer has a fixed magnetization direction and may be anti-ferromagnetically exchange coupled to a magnetic pinned layer, which has a fixed but opposite or anti-parallel magnetization direction. Upon the application of an appropriate current through the MTJ, the magnetization direction of the magnetic free layer can be switched between two directions: parallel and antiparallel with respect to the magnetization direction of the magnetic reference layer. The non-magnetic tunnel junction layer is normally made of an insulating material with a thickness ranging from a few to a few tens of angstroms. When the magnetization directions of the magnetic free and reference layers are substantially parallel, electrons polarized by the magnetic reference layer can tunnel through the insulating tunnel junction layer, thereby decreasing the electrical resistivity of the MTJ. Conversely, the electrical resistivity of the MTJ is high when the magnetization directions of the magnetic reference and free layers are substantially anti-parallel. Accordingly, the stored logic in the magnetic memory element can be switched by changing the magnetization direction of the magnetic free layer.

Based on the relative orientation between the magnetic reference and free layers and the magnetization directions thereof, a MTJ can be classified into one of two types: in-plane MTJ, the magnetization directions of which lie substantially within a plane parallel to the same layers, or perpendicular MTJ, the magnetization directions of which are substantially perpendicular to the plane.

A STT-MRAM device can be divided into a memory region including MTJ memory elements for storing information, and a peripheral circuit region including various types of peripheral circuit devices for detecting states in memory elements, controlling memory elements, and input/output operations. Fabrication of the MTJ memory elements are designed to be integrated into the back end wiring structure of back-end-of-line (BEOL) CMOS process following front-end-of-line (FEOL) CMOS process, in which selection and logic transistors are fabricated.

FIG. 1 is a cross sectional view of a conventional STT-MRAM device having a memory cell region 50 and a peripheral circuit region 52. The memory region 50 includes a plurality of MTJ memory elements 53 disposed on top of memory landing pads 56. Each of the plurality of the MTJ memory elements 53 includes a MTJ 54 and a top electrode 55 disposed thereon. The MTJ 54 comprises a magnetic reference layer 58 and a magnetic free layer 60 with a non-magnetic tunnel junction layer 62 interposed therebetween. The memory landing pads 56 are disposed on top of memory bottom contacts 64, which are coupled to selection transistors (not shown) formed in the FEOL process. The top electrode 55 disposed on top of the MTJ 54 is electrically connected to top metal wires (not shown) directly or through an optional via stud (not shown). The periphery circuit region 52 includes at least a periphery landing pad 56' disposed on top of a periphery bottom contact 64'. A via 68 is disposed on top of the periphery landing pad 56' and is coupled to a metal wire thereabove. Hence, the transistor (not shown) in the periphery circuit region 52 is connected to the metal wire above through a succession of the periphery bottom contact 64', the periphery landing pad 56', and the via 68.

According to the design rule for semiconductor manufacturing process, the minimum size of the landing pads 64 and 64' in FIG. 1 is approximately 15 $F^2$, where F denotes the minimum feature size that can be reliably manufactured for a technology node. Since a minimum clearance between adjacent landing pads is needed, the effective space or footprint required for each landing pad is increased to approximately 20 $F^2$. Therefore, the cell size of a MTJ memory may easily exceeds 30 $F^2$ when the placement of corresponding selection transistor is taken into account.

A possible approach to reducing the memory cell size is by removing the landing pads, as shown in FIG. 2. While this approach allows more closer packing of the memory cells in the memory region, the alignment error between the periphery bottom contact 64' and the via 68 disposed thereon may reduce device yield, especially at small feature sizes.

Therefore, there is a need for a via landing pad in the peripheral circuit of a MRAM device that does not increase the memory cell size.

SUMMARY

The present invention is directed to a memory device having a via landing pad in the peripheral circuit that minimizes the memory cell size. A memory device having features of the present invention comprises a memory cell region and a peripheral circuit region. The peripheral region includes a substrate and a bottom contact formed therein; a landing pad formed on top of the bottom contact; and a via formed on top of the landing pad. The landing pad includes a conductive layer and a degraded insulating layer, thereby allowing electric current to conduct through the landing pad.

According to another aspect of the present invention, a memory device comprises a peripheral circuit region and a magnetic memory cell region including at least a magnetic tunnel junction (MTJ) memory element. The peripheral circuit region comprises a substrate and a bottom contact formed therein; a landing pad formed on top of the bottom contact; and a via formed on top of the landing pad. The landing pad includes a first magnetic layer structure and a second magnetic layer structure with a degraded insulating junction layer interposed therebetween, thereby allowing electric current to conduct through the landing pad.

According to still another aspect of the present invention, a memory device comprises a memory cell region and a peripheral circuit region. The peripheral circuit region includes a substrate and a bottom contact formed therein; a landing pad formed on top of the bottom contact and comprising a conductive layer and an insulating layer thereabove with an opening; and a via partly embedded in the landing pad and directly coupled to the conductive layer through the opening.

According to yet another aspect of the present invention, a memory device comprises a peripheral circuit region and a magnetic memory cell region including at least a magnetic tunnel junction (MTJ) memory element. The peripheral circuit region comprises a substrate and a bottom contact formed therein; a landing pad including a first magnetic layer structure formed on top of the bottom contact and a second magnetic layer structure separated from the first magnetic layer structure by an insulating tunnel junction layer, wherein each of the insulating tunnel junction layer and the second magnetic layer structure has an opening aligned to each other; and a via partly embedded in the landing pad and directly coupled to the first magnetic layer structure through the openings.

BRIEF DESCRIPTION OF THE DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures.

DETAILED DESCRIPTION

Figure 3:
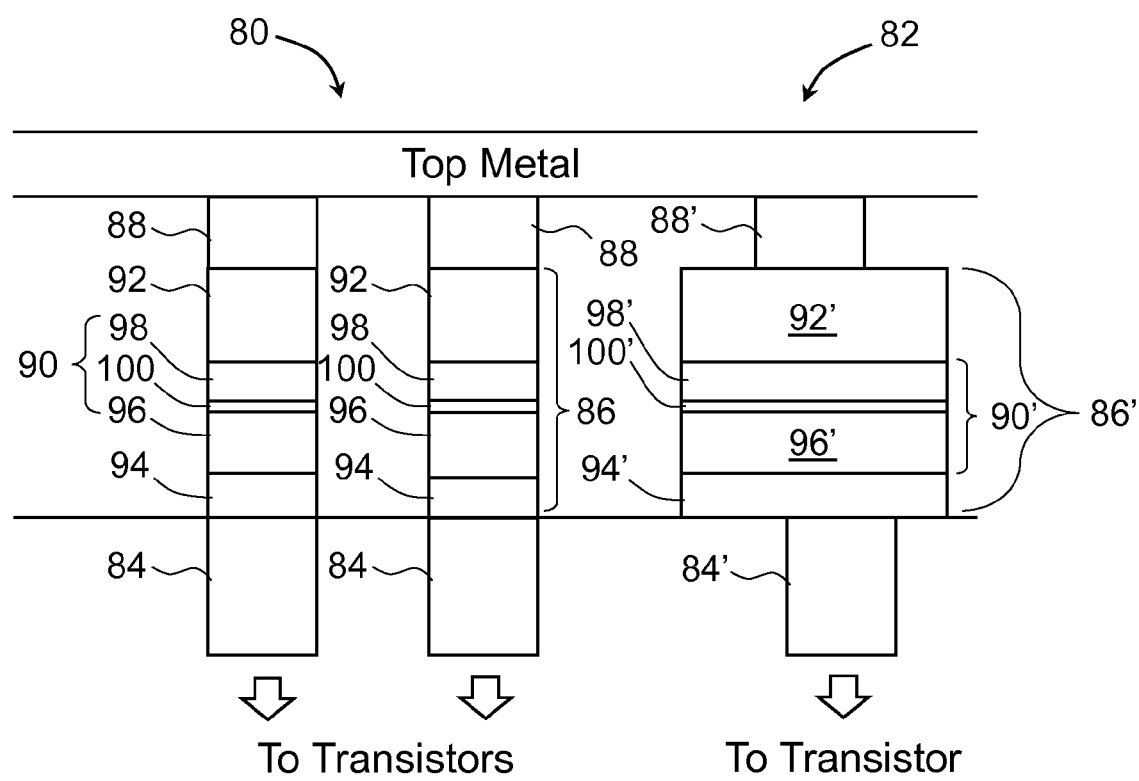
FIG. 3 is a cross sectional view of a STT-MRAM device having a landing pad formed of MTJ layer stack at the peripheral circuit in accordance with an embodiment of the present invention.

An embodiment of the present invention as applied to a STT-MRAM device having a peripheral circuit will now be described with reference to FIG. 3. Referring now to FIG. 3, the illustrated device comprises a memory region 80 and a periphery circuit region 82. The memory region 80 includes a plurality of memory bottom contacts 84 formed in a substrate, a plurality of MTJ memory elements 86 formed on top of the memory bottom contacts 84, a plurality of memory vias 88 formed on top of the MTJ memory elements 86. The memory vias 88 are coupled to a top metal wire layer on top. The memory bottom contacts 84 are coupled to selection transistors (not shown) at bottom.

Each of the MTJ memory elements 86 includes a MTJ layer stack 90, a top electrode 92 formed thereon, and an optional bottom electrode 94 formed therebeneath. The MTJ layer stack 90 comprises a magnetic reference layer structure 96 and a magnetic free layer structure 98 with a non-magnetic junction layer 100 interposed therebetween. The non-magnetic junction layer 100 may be formed of an insulating material, such as magnesium oxide (MgO) and aluminum oxide ($AlO_x$). The magnetic reference layer structure 96 and the magnetic free layer structure 98 each may comprise a single layer of ferromagnetic material or a plurality of magnetic layers. For example, the magnetic reference layer structure 96 and the magnetic free layer structure 98 each may be formed of a single layer of ferromagnetic alloy comprising cobalt and iron or an alloy comprising cobalt, iron, and boron. Alternatively, the magnetic reference layer structure 96 may include an anti-ferromagnetic (AFM) layer coupled to a synthetic anti-ferromagnetic (SAF) structure comprising a pinned magnetic layer and a reference magnetic layer with a ruthenium (Ru) layer interposed therebetween. In another alternative case, the magnetic reference layer structure 96 may consist only a SAF structure. In still another alternative case, the magnetic free layer structure 98 may comprise a plurality of magnetic layers separated by one or more non-magnetic layers. The stacking order of the magnetic free layer structure 108 and the magnetic reference layer structure 106 in the MTJ layer stack 90 can be reversed without affecting the MTJ performance.

With continuing reference to FIG. 3, the peripheral region 82 includes at least a peripheral bottom contact 84' formed in the substrate, at least a peripheral landing pad 86' formed on top of the peripheral bottom contact 84', at least a peripheral via 88' formed on top of the peripheral landing pad 86'. The peripheral via 88' is coupled to a top metal wire layer on top. The peripheral bottom contacts 84' is coupled to a transistor (not shown) therebeneath.

The peripheral landing pad 86', which has the same layer structure as the MTJ memory element 86, includes a peripheral MTJ layer stack 90', a peripheral top electrode 92' formed thereon, and an optional peripheral bottom electrode 94' formed therebeneath. The peripheral MTJ layer stack 90' comprises a peripheral magnetic reference layer structure 96' and a peripheral magnetic free layer structure 98' with a peripheral tunnel junction layer 100' interposed therebetween. The peripheral landing pad 86' is concurrently fabricated with the MTJ memory elements 86 and thus share the same layer structure as the MTJ memory elements 86. Accordingly, the layers 90'-100' of the peripheral landing pad 86' have the same compositions as the layers 90-100 of the MTJ memory elements 86, respectively. However, the size of the peripheral landing pad 86' may be at least several times larger than the MTJ memory elements 86 because of larger clearance in between sparsely populated transistors in the peripheral region 82. Compared with the resistance of about $10^3$ ohms for the MTJ memory elements 86, the larger size of the peripheral landing pad 86' may lower the resistance to about $10^2$ ohms.

Figure 4:
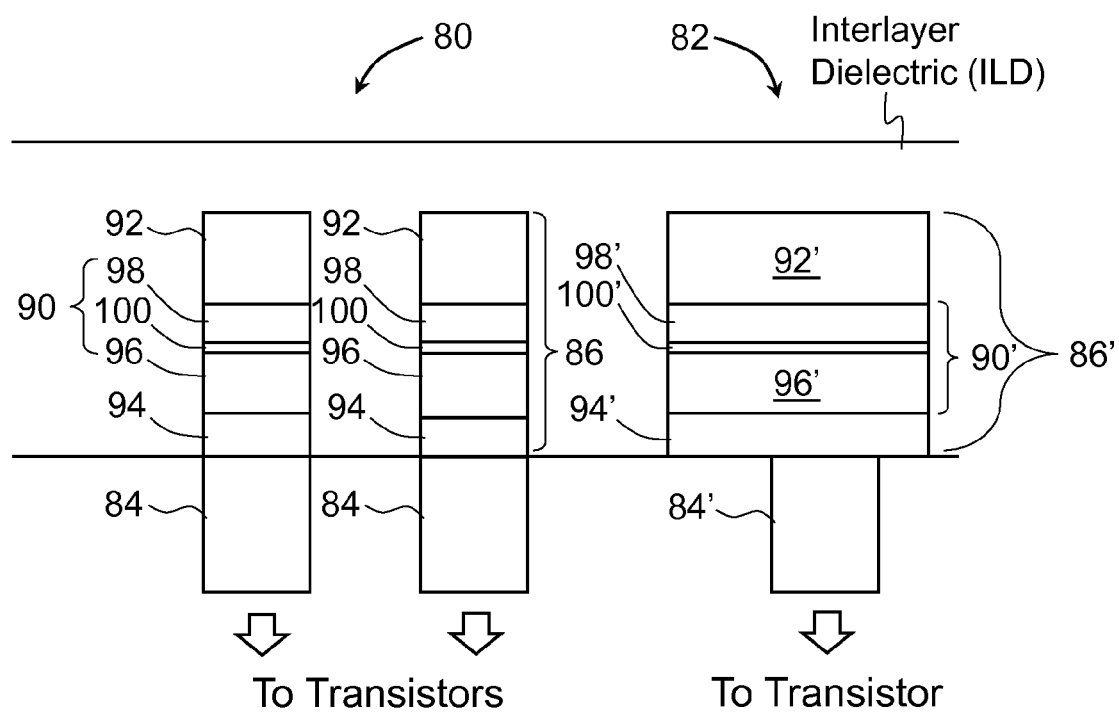
FIGS. 4 and 5 are cross sectional views illustrating various stages in formation of a STT-MRAM device having a landing pad formed of MTJ layer stack at the peripheral circuit in accordance with an embodiment of the present invention.

Fabrication of the STT-MRAM device will now be described with reference to FIGS. 4 and 5, which illustrate various intermediate structures of the memory device illustrated in FIG. 3. In the drawings, numerals 80-100 and 84'-100' denote the same components as those shown in FIG. 3. Referring now to FIG. 4, the processing starts by providing a substrate having a plurality of the memory bottom contacts 84 and at least one of the peripheral bottom contact 84' formed therein. The MTJ memory elements 86 and the peripheral landing pad 86' are formed on top of the memory bottom contacts 84 and the peripheral bottom contact 84', respectively, by sequentially depositing corresponding films on the substrate and followed by patterning the same films using photolithography and vertical dry etching. The MTJ memory elements 86 and the peripheral landing pad 86' are then encapsulated by an interlayer dielectric (ILD) layer by depositing an ILD material and followed by planarizing the ILD material using chemical-mechanical polishing (CMP), resulting in the structure illustrated in FIG. 4.

Figure 5:
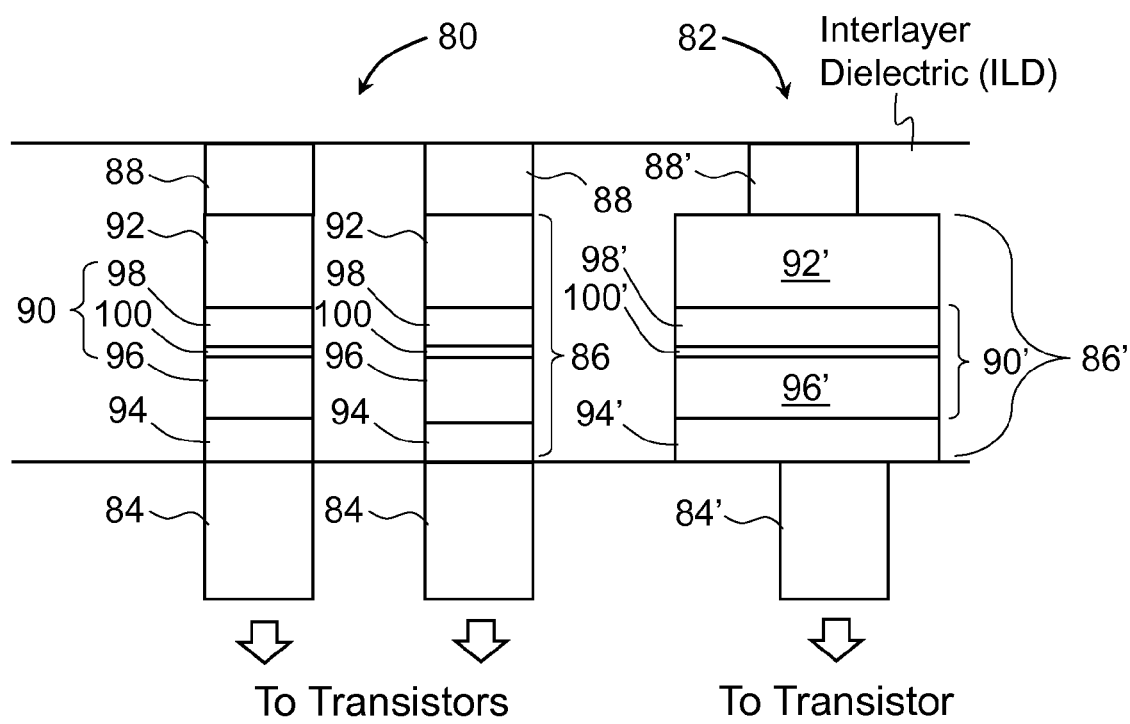

Referring to FIG. 5, the processing continues by forming the memory vias 88 and the peripheral via 88' on top of the MTJ memory elements 86 and the peripheral landing pad 86', respectively, by etching via holes into the ILD layer and then filling the via holes with a conductive material, such as tungsten and copper.

Figure 1:
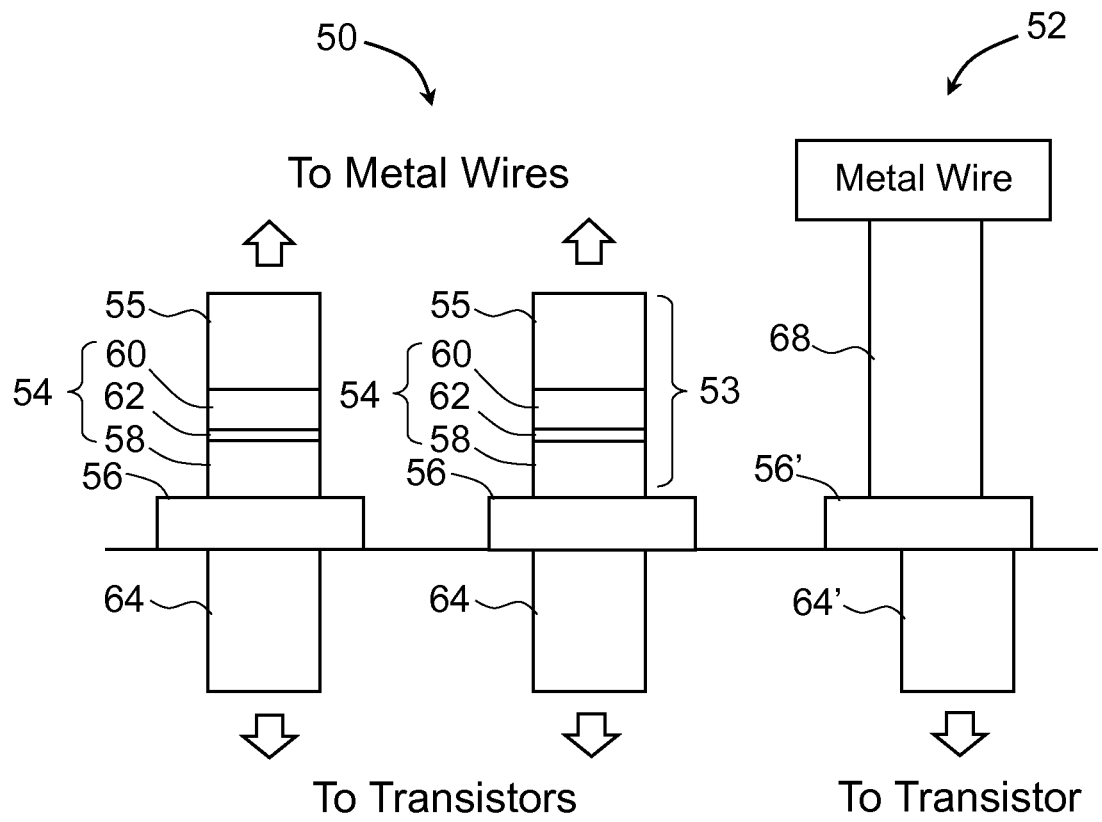
FIG. 1 is a cross sectional view of a STT-MRAM device having conventional via landing pads between transistors formed in FEOL and subsequent structures formed in BEOL.
Figure 2:
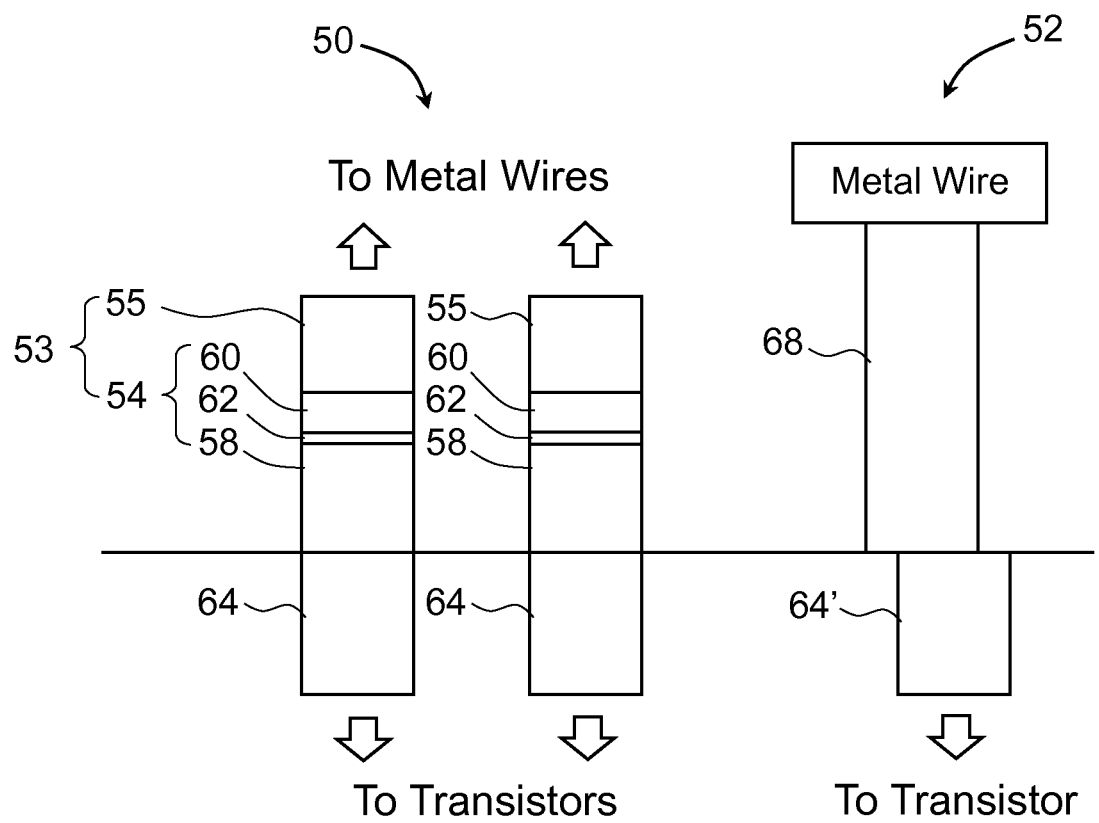
FIG. 2 is a cross sectional view of a STT-MRAM device without via landing pad between transistors formed in FEOL and subsequent structures formed in BEOL.

Since the peripheral landing pad 86' is concurrently fabricated with the MTJ memory elements 86, the STT-MRAM device of FIG. 3 has the advantages of fewer processing steps and smaller memory cell size comparing with the prior art device shown in FIG. 1.

Figure 6:
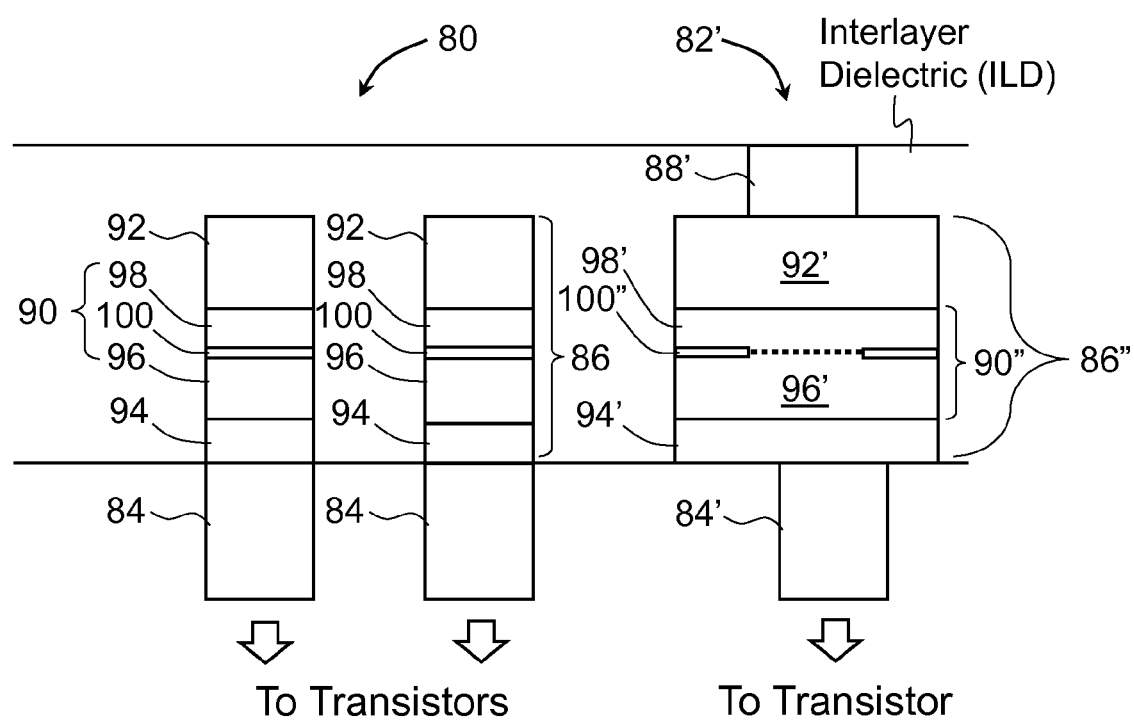
FIG. 6 is a cross sectional view of a STT-MRAM device having a landing pad formed of MTJ layer stack at the peripheral circuit in accordance with a preferred embodiment of the present invention.

A preferred embodiment of the present invention as applied to a STT-MRAM device having a peripheral circuit is illustrated in FIG. 6. In the drawing, numerals 80-100 and 84'-100' denote the same components as those shown in FIG. 3. The memory device of FIG. 6 is different from the memory device of FIG. 3 in that the insulating peripheral tunnel junction layer 100" of the peripheral landing pad 86" of the former has been deliberately damaged or degraded, thereby allowing electric current to readily conduct therethrough. As such, the peripheral landing pad 86" of the device of FIG. 6 has an electrical resistance of only several ohms, which is significantly lower than the electrical resistance of about $10^2$ ohms for the peripheral landing pad 86' of the device of FIG. 3.

The peripheral tunnel junction layer 100" may be purposely damaged or degraded by implanting conductive atoms therein thorough the via hole for the peripheral via 88'. For MTJ memory elements having multiple insulating layers, additional implantation may be required to target the insulating layers. The peripheral tunnel junction layer 100" and any other insulating layers in the peripheral landing pad 86' may also be purposely damaged or degraded by applying a high voltage and/or current to "pop" the junction layer and any other insulating layers open.

Figure 7:
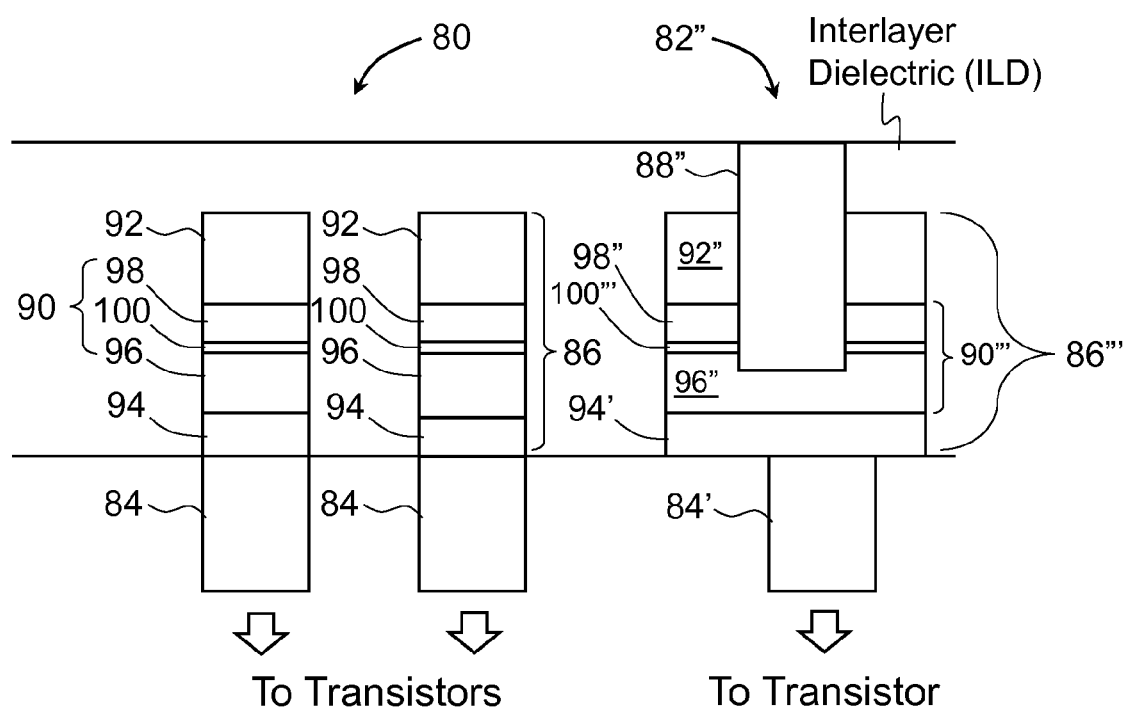
FIG. 7 is a cross sectional view of a STT-MRAM device having a landing pad formed of MTJ layer stack at the peripheral circuit in accordance with another preferred embodiment of the present invention.

Another preferred embodiment of the present invention as applied to a STT-MRAM device having a peripheral circuit is illustrated in FIG. 7. In the drawing, numerals 80-100 and 84'-100' denote the same components as those shown in FIG. 3. The memory device comprises the memory region 80 and a peripheral circuit region 82", which comprises a substrate and the peripheral bottom contact 84' formed therein, a peripheral landing pad 86'" formed on top of the peripheral bottom contact 84', and a peripheral via 88" partly embedded into the peripheral landing pad 86'". The peripheral landing pad 86'" comprises a peripheral magnetic reference layer structure 96" formed on the optional peripheral bottom electrode 94', a peripheral magnetic free layer structure 98" separated from the peripheral magnetic reference layer structure 96" by an peripheral tunnel junction layer 100'", and a peripheral top electrode 92" formed on top of the peripheral magnetic free layer structure 98". Each of the peripheral tunnel junction layer 100'", the peripheral magnetic free layer structure 98", and the peripheral top electrode 92" has an opening aligned to each other, allowing the peripheral via 88" to pass through the openings and directly couple to the peripheral magnetic reference layer structure 96" beneath the peripheral tunnel junction layer 100'".

The memory device of FIG. 7 is different from the memory device of FIG. 3 in that the peripheral via 88" of the former extends into the peripheral landing pad 86'" and breaks through the peripheral tunnel junction layer 100'", thereby directly coupling to the peripheral magnetic reference layer structure 96" beneath the tunnel junction layer 100'". The bottom of the peripheral via 88" may directly couple to any conductive layer between the peripheral junction layer 100" and the peripheral bottom contact 84', such as the peripheral bottom electrode 94' or the perpendicular magnetic reference layer structure 96". For MTJ memory elements having multiple insulating layers, the bottom of the peripheral via 88" may break through the insulating layer that is closest to the peripheral bottom contact 84'. The peripheral landing pad 86'" of the device in FIG. 7 has an electrical resistance of several ohms because the peripheral via 88" is directly coupled to conductive layers beneath the partly removed peripheral junction layer 100'".

The via hole for the peripheral via 88" can be formed by vertical dry etching of the peripheral top electrode 92", the peripheral magnetic free layer structure 98", and the peripheral junction layer 100'". The peripheral via 88" is then formed by filling the via hole with a conductive material, such as tungsten or copper.

The previously described embodiments of the present invention have many advantages, including cost-saving from having smaller memory cells and fewer process steps. It is important to note, however, that the invention does not require that all the advantageous features and all the advantages need to be incorporated into every embodiment of the present invention. All the features disclosed in this specification, including any accompanying claims, abstract, and drawings, may be replaced by alternative features serving the same, equivalent or similar purpose, unless expressly stated otherwise. Thus, unless expressly stated otherwise, each feature disclosed is one example only of a generic series of equivalent or similar features.

While the present invention has been shown and described with reference to certain preferred embodiments, it is to be understood that those skilled in the art will no doubt devise certain alterations and modifications thereto which nevertheless include the true spirit and scope of the present invention. For example, although the via landing pad in the peripheral circuit having similar layer structure as the MTJ memory elements is described above, the present invention can be equally applied to other types of memory elements which include one or more insulating layers therein. Thus the scope of the invention should be determined by the appended claims and their legal equivalents, rather than by examples given.

What is claimed is:

1. A memory device including:
    a magnetic memory cell region including at least a magnetic tunnel junction (MTJ) memory element having a variable resistance; and
    a peripheral circuit region comprising:
        a substrate and a bottom contact formed therein;
        a landing pad formed on top of said bottom contact, said landing pad comprising a first magnetic layer structure and a second magnetic layer structure with a degraded insulating junction layer interposed therebetween, thereby allowing electric current to conduct through said landing pad; and
        a via formed on top of said landing pad,
        wherein neither said landing pad nor said via is directly connected to an MTJ memory element.

2. The device according to claim 1, wherein said degraded insulating junction layer is made of magnesium oxide (MgO).

3. The device according to claim 1, wherein said via is made of tungsten (W) or copper (Cu).

4. The device according to claim 1, wherein at least one of said first and second magnetic layer structures is made of an alloy layer comprising cobalt (Co), iron (Fe), and boron (B).

5. The device according to claim 1, wherein at least one of said first and second magnetic layer structures comprises a plurality of magnetic layers.

6. The device according to claim 1, wherein one of said first and second magnetic layer structures comprises two magnetic layers having two opposite fixed magnetization directions with a ruthenium layer interposed therebetween.

7. The device according to claim 1, wherein one of said first and second magnetic layer structures comprises an anti-ferromagnetic layer and two magnetic layers having two opposite fixed magnetization directions with a ruthenium layer interposed therebetween.

8. The device according to claim 1, wherein each MTJ memory element comprises multiple magnetic layers having magnetization directions that are substantially perpendicular to respective layer planes.

9. A memory device comprising:
a memory cell region comprising a plurality of memory cells, each memory cell including a magnetic tunnel junction (MTJ) memory element having a variable resistance; and
a peripheral circuit region including:
a substrate and a bottom contact formed therein;
a landing pad formed on top of said bottom contact, said landing pad including at least a conductive layer and an insulating layer thereabove with an opening; and
a via partly embedded in said landing pad and directly coupled to said conductive layer through said opening,
wherein neither said landing pad nor said via is directly connected to an MTJ memory element.

10. The device according to claim 9, wherein each MTJ memory element comprises multiple magnetic layers having magnetization directions that are substantially perpendicular to respective layer planes.

11. A memory device comprising:
a magnetic memory cell region including at least a magnetic tunnel junction (MTJ) memory element having a variable resistance; and
a peripheral circuit region comprising:
a substrate and a bottom contact formed therein;
a landing pad comprising a first magnetic layer structure formed on top of said bottom contact and a second magnetic layer structure separated from said first magnetic layer structure by an insulating tunnel junction layer, each of said insulating tunnel junction layer and said second magnetic layer structure having an opening aligned to each other; and
a via partly embedded in said landing pad and directly coupled to said first magnetic layer structure through said openings,
wherein neither said landing pad nor said via is directly connected to an MTJ memory element.

12. The device according to claim 11, wherein said degraded insulating junction layer is made of magnesium oxide (MgO).

13. The device according to claim 11, wherein said via is made of tungsten (W) or copper (Cu).

14. The device according to claim 11, wherein at least one of said first and second magnetic layer structures is made of an alloy layer comprising cobalt (Co), iron (Fe), and boron (B).

15. The device according to claim 11, wherein at least one of said first and second magnetic layer structures comprises a plurality of magnetic layers.

16. The device according to claim 11, wherein one of said first and second magnetic layer structures comprises two magnetic layers having two opposite fixed magnetization directions with a ruthenium layer interposed therebetween.

17. The device according to claim 11, wherein one of said first and second magnetic layer structures comprises an anti-ferromagnetic layer and two magnetic layers having two opposite fixed magnetization directions with a ruthenium layer interposed therebetween.

18. The device according to claim 11, wherein each MTJ memory element comprises multiple magnetic layers having magnetization directions that are substantially perpendicular to respective layer planes.

19. A memory device including:
a memory cell region comprising a plurality of memory cells, each memory cell including a magnetic tunnel junction (MTJ) memory element having a variable resistance; and
a peripheral circuit region comprising:
a substrate and a bottom contact formed therein;
a landing pad formed on top of said bottom contact, said landing pad comprising a conductive layer and a degraded insulating layer formed thereon, thereby allowing electric current to conduct through said landing pad; and
a via formed on top of said landing pad,
wherein neither said landing pad nor said via is directly connected to an MTJ memory element, wherein each MTJ memory element comprises multiple magnetic layers having magnetization directions that are substantially perpendicular to respective layer planes.

* * * * *